US009479139B2

(12) United States Patent
Ruby et al.

(10) Patent No.: US 9,479,139 B2
(45) Date of Patent: Oct. 25, 2016

(54) RESONATOR DEVICE INCLUDING ELECTRODE WITH BURIED TEMPERATURE COMPENSATING LAYER

(75) Inventors: Richard C. Ruby, Menlo Park, CA (US); Wei Pang, Fort Collins, CO (US); Qiang Zou, Fort Collins, CO (US); Donald Lee, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 777 days.

(21) Appl. No.: 12/769,791

(22) Filed: Apr. 29, 2010

(65) Prior Publication Data

US 2011/0266925 A1 Nov. 3, 2011

(51) Int. Cl.
| H01L 41/08 | (2006.01) |
| H03H 9/13 | (2006.01) |
| H03H 3/04 | (2006.01) |
| H03H 9/02 | (2006.01) |
| H03H 9/17 | (2006.01) |

(52) U.S. Cl.
CPC ............ *H03H 9/131* (2013.01); *H03H 3/04* (2013.01); *H03H 9/02102* (2013.01); *H03H 9/173* (2013.01); *H03H 9/175* (2013.01)
USPC .......................................... 310/320; 310/346

(58) Field of Classification Search
USPC ....................................... 310/320, 324, 346
See application file for complete search history.

(56) References Cited

U.S. PATENT DOCUMENTS

| 4,456,850 A | * | 6/1984 | Inoue et al. | ................. 310/324 |
| 5,587,620 A | | 12/1996 | Ruby et al. | |
| 5,872,493 A | | 2/1999 | Ella | |
| 5,873,153 A | | 2/1999 | Ruby et al. | |
| 5,956,292 A | | 9/1999 | Bernstein | |
| 6,107,721 A | | 8/2000 | Lakin | |
| 6,384,697 B1 | | 5/2002 | Ruby | |
| 6,420,820 B1 | * | 7/2002 | Larson, III | ................. 310/346 |
| 6,441,539 B1 | * | 8/2002 | Kitamura et al. | ............ 310/346 |
| 6,507,983 B1 | | 1/2003 | Ruby et al. | |
| 6,732,415 B2 | | 5/2004 | Nakatani et al. | |
| 6,828,713 B2 | | 12/2004 | Bradley et al. | |
| 6,849,475 B2 | | 2/2005 | Kim | |

(Continued)

FOREIGN PATENT DOCUMENTS

| CN | 101931380 A | 12/2010 |
| CN | 101958696 A | 1/2011 |

(Continued)

OTHER PUBLICATIONS

Zou, et al., "High Coupling Coefficient Temperature Compensated FBAR Resonator for Oscillator Application With Wide Pulling Range", 2010 IEEE International Frequency Control Symposium (FCS).

(Continued)

*Primary Examiner* — J. San Martin

(57) ABSTRACT

An acoustic resonator device includes a composite first electrode on a substrate, a piezoelectric layer on the composite electrode, and a second electrode on the piezoelectric layer. The first electrode includes a buried temperature compensating layer having a positive temperature coefficient. The piezoelectric layer has a negative temperature coefficient, and thus the positive temperature coefficient of the temperature compensating layer offsets at least a portion of the negative temperature coefficient of the piezoelectric layer.

28 Claims, 4 Drawing Sheets

(56) References Cited

U.S. PATENT DOCUMENTS

| | | | |
|---|---|---|---|
| 6,906,451 B2 * | 6/2005 | Yamada et al. | 310/324 |
| 6,936,954 B2 * | 8/2005 | Peczalski | 310/346 |
| 7,212,082 B2 | 5/2007 | Nagao et al. | |
| 7,259,498 B2 * | 8/2007 | Nakatsuka et al. | 310/324 |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,369,013 B2 | 5/2008 | Fazzio | |
| 7,388,454 B2 | 6/2008 | Ruby et al. | |
| 7,391,285 B2 | 6/2008 | Larson et al. | |
| 7,408,428 B2 * | 8/2008 | Larson, III | 333/187 |
| 7,508,286 B2 | 3/2009 | Ruby et al. | |
| 7,561,009 B2 | 7/2009 | Larson, III et al. | |
| 7,561,010 B2 | 7/2009 | Hikita et al. | |
| 7,562,429 B2 | 7/2009 | Larson et al. | |
| 7,629,865 B2 | 12/2009 | Ruby | |
| 7,791,434 B2 | 9/2010 | Fazzio et al. | |
| 8,230,562 B2 | 7/2012 | Fazzio et al. | |
| 8,248,185 B2 | 8/2012 | Choy et al. | |
| 8,330,556 B2 | 12/2012 | Miller et al. | |
| 8,456,257 B1 | 6/2013 | Fattinger | |
| 9,197,185 B2 | 11/2015 | Zou | |
| 2006/0035471 A1 | 2/2006 | Hill | |
| 2006/0226932 A1 | 10/2006 | Fazzio et al. | |
| 2007/0120625 A1 | 5/2007 | Larson et al. | |
| 2007/0205850 A1 | 9/2007 | Jamneala et al. | |
| 2007/0267942 A1 | 11/2007 | Matsumoto et al. | |
| 2010/0187948 A1 | 7/2010 | Sinha | |
| 2010/0295631 A1 | 11/2010 | Coudrain et al. | |
| 2010/0327701 A1 * | 12/2010 | Grannen et al. | 310/346 |
| 2010/0327994 A1 | 12/2010 | Choy et al. | |
| 2011/0121916 A1 | 5/2011 | Barber et al. | |
| 2011/0180391 A1 | 7/2011 | Larson et al. | |
| 2011/0227671 A1 | 9/2011 | Zhang | |
| 2011/0266925 A1 | 11/2011 | Ruby et al. | |
| 2012/0050236 A1 | 3/2012 | Lo et al. | |
| 2012/0161902 A1 | 6/2012 | Feng et al. | |
| 2012/0177816 A1 | 7/2012 | Larson et al. | |
| 2012/0218055 A1 | 8/2012 | Burak et al. | |
| 2012/0218056 A1 | 8/2012 | Burak | |
| 2012/0218058 A1 | 8/2012 | Burak et al. | |
| 2012/0218059 A1 | 8/2012 | Burak et al. | |
| 2012/0218060 A1 | 8/2012 | Burak et al. | |
| 2014/0292149 A1 | 10/2014 | Zou | |
| 2014/0292150 A1 | 10/2014 | Zou | |
| 2016/0118957 A1 | 4/2016 | Burak | |

FOREIGN PATENT DOCUMENTS

| | | |
|---|---|---|
| JP | 58-137317 | 8/1983 |
| JP | 58-156220 | 9/1983 |
| JP | 60016010 | 1/1985 |
| JP | 11-58730 | 6/1989 |
| RU | 2066856 | 9/1996 |
| WO | 2005043756 A1 | 5/2005 |
| WO | WO-2010122024 | 10/2010 |

OTHER PUBLICATIONS

Copending U.S. Appl. No. 13/168,101, filed Jun. 24, 2011.
HTE Labs, "Plasma Enhanced Chemical Vapor Deposition", Jul. 6, 2009.
Notice of Allowance mailed Mar. 9, 2016 in U.S. Appl. No. 14/040,469.
Notice of Allowance mailed Jun. 8, 2016 in U.S. Appl. No. 14/040,469.
Restriction Requirement mailed Mar. 28, 2013 in U.S. Appl. No. 13/852,469.
Office Action mailed Jan. 21, 2016 in U.S. Appl. No. 13/852,469.
Office Action mailed Feb. 4, 2016 in U.S. Appl. No. 14/521,406.
Office Action mailed May 2, 2012 in U.S. Appl. No. 13/404,095.
Notice of Allowance mailed Sep. 19, 2012 in U.S. Appl. No. 13/404,095.
Office Action mailed Oct. 15, 2014 in U.S. Appl. No. 13/601,384.
Office Action mailed Apr. 23, 2015 in U.S. Appl. No. 13/601,384.
Notice of Allowance mailed Jul. 24, 2015 in U.S. Appl. No. 13/601,384.
Office Action mailed Dec. 31, 2012 in U.S. Appl. No. 13/624,046.
Office Action dated Mar. 28, 2016 in Chinese Application No. 201310392017.1 (Unofficial/non-certified translation provided by foreign agent included).
English language machine translation of CN101958696A, published Jan. 26, 2011.
English language machine translation of CN101931380A, published Dec. 29, 2010.
English language translation of pending claims dated May 2016 in Chinese Application No. 201310392017.1.

* cited by examiner

RESONATOR DEVICE INCLUDING ELECTRODE WITH BURIED TEMPERATURE COMPENSATING LAYER

BACKGROUND

Electrical resonators are widely incorporated in modern electronic devices. For example, in wireless communications devices, radio frequency (RF) and microwave frequency resonators are used as filters, such as ladder filters having electrically connected series and shunt resonators formed in a ladder structure. The filters may be included in a duplexer, for example, connected between a single antenna and a receiver and a transmitter for respectively filtering received and transmitted signals.

Various types of filters use mechanical resonators, such as bulk acoustic wave (BAW), surface acoustic wave (SAW), and solidly mounted resonator (SMR)-BAW resonators. The resonators generally convert electrical signals to mechanical signals or vibrations, and/or mechanical signals or vibrations to electrical signals. A BAW resonator, for example, is an acoustic stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as a film bulk acoustic resonator (FBAR). FBARs resonate at GHz frequencies, and are thus relatively compact, having thicknesses on the order of microns and length and width dimensions of hundreds of microns.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, in particular, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range of the FCC or government designated passband. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the filter eventually settles at some high temperature.

PAs are designed specifically to handle the worst case power handling of the filter at the corner of the pass band. Currents of a typical PA can run from a few mA at the center of the filter passband to about 380 mA-450 mA at the edges. This is a huge power draw on the PA, as well as the battery that drives the cellular phone. This is one reason that a cellular phone operating more in the transmit mode (i.e., talk time) than in the receive mode (i.e., listening time) drains battery power more quickly.

In order to prevent or reduce rising temperatures, a conventional filter may include a layer of oxide material within the piezoelectric layer of the acoustic stack. The oxide material has a positive temperature coefficient, which at least partially offsets the negative temperature coefficients of the metal electrodes and the piezoelectric material, respectively. For example, the oxide material may be placed in the center of the piezoelectric layer or at either end of the piezoelectric layer between the electrodes. However, that the acoustic coupling coefficient ($kt^2$) of the resonator is greatly compromised by the addition of oxide material to the piezoelectric layer. This is because the oxide material appears as a "dead" capacitor in series with the active piezoelectric material dielectric. Further, the oxide material may contaminate the piezoelectric material. For example, when the piezoelectric material is aluminum nitride (AlN), the oxide material causes the AlN to become a chemical compound that includes oxygen (e.g., $AlN_{(x)}O_{(y)}$), which is a non-piezoelectric material, thus further degrading the acoustic coupling coefficient.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
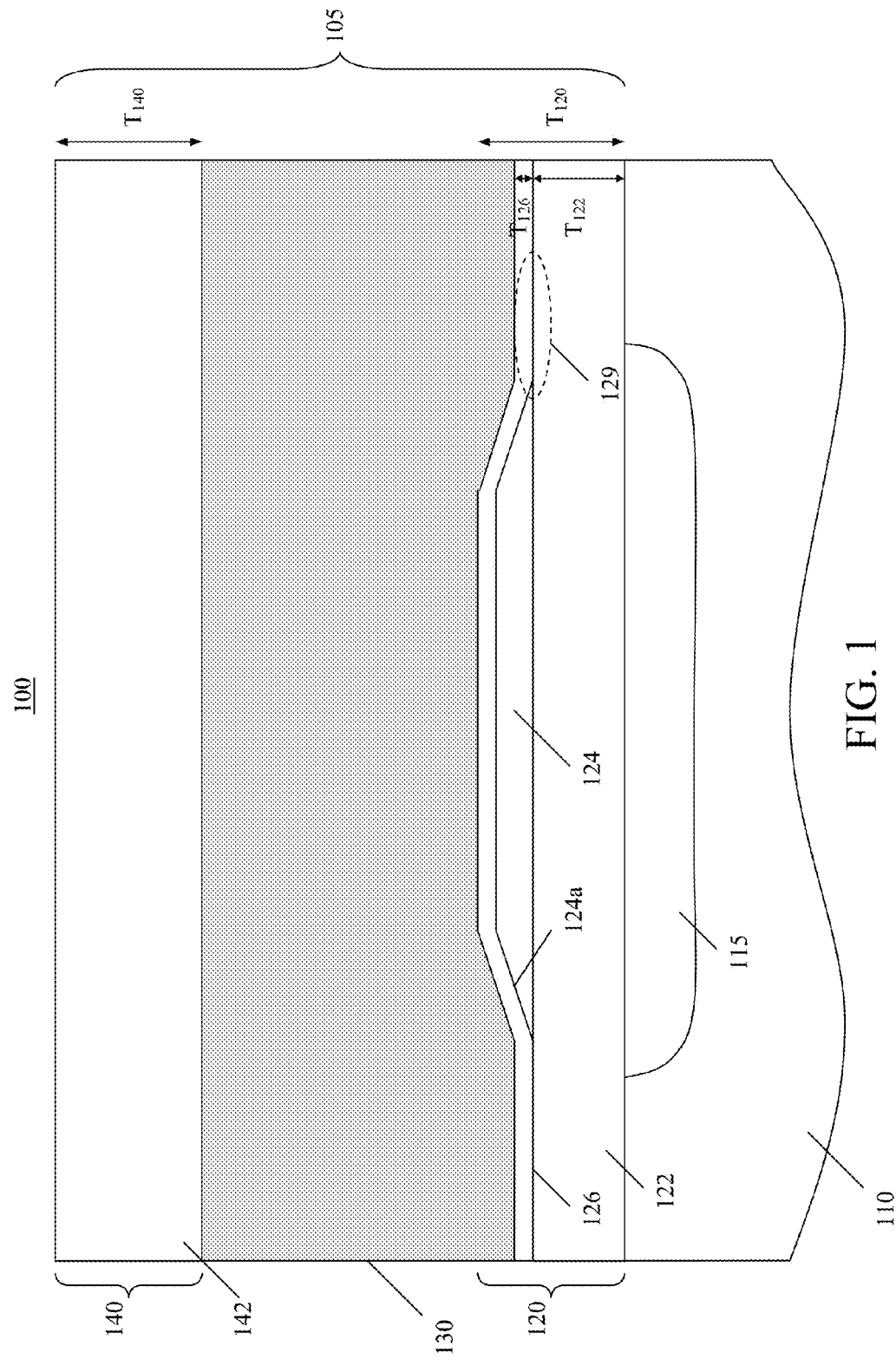
FIG. 1 is a cross-sectional diagram illustrating an acoustic resonator device, including an electrode with a buried temperature compensating layer, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Aspects of the present teachings are relevant to components of BAW and FBAR devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454 and 7,629,865 to Ruby et al.; U.S. Pat. No. 7,280,007 to Hongjun Feng et al.; and U.S. Patent Application Pub. No. 2007-0205850 to Jamneala et al. The disclosures of these patents and published patent applications are hereby incorporated by reference. It is emphasized that the components, materials and method of fabrication described in these patents and patent applications are representative and other methods of fabrication and materials within the purview of one of ordinary skill in the art are contemplated.

According to various embodiments, a resonator device has an acoustic stack with a piezoelectric layer between top and bottom electrodes, at least one of which is a composite electrode having a temperature compensating layer deposited between an electrode layer and a conductive interposer layer. The temperature compensating layer may be formed of an oxide material, such as boron silicate glass (BSG), for example, having a positive temperature coefficient which offsets at least a portion of the negative temperature coefficients of the piezoelectric layer and the conductive material in the top and bottom electrodes. The conductive interposer layer thus makes a DC electrical connection with the electrode layer in the composite electrode, effectively shorting out a capacitive component of the temperature compensating layer and increasing a coupling coefficient $kt^2$ of the resonator device. Also, the conductive interposer, which is positioned between the temperature compensating layer the piezoelectric layer, presents a barrier preventing oxygen in the oxide layer from diffusing into the piezoelectric material of the piezoelectric layer. In various embodiments, the composite electrode may be the bottom electrode, the top electrode, or both, in the acoustic stack.

FIG. 1 is a cross-sectional view of an acoustic resonator device, which includes an electrode having a buried temperature compensating layer, according to a representative embodiment.

Referring to FIG. 1, illustrative resonator device 100 includes acoustic stack 105 formed on substrate 110. The substrate 110 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In the depicted embodiment, the substrate 110 includes a cavity 115 formed beneath the acoustic stack 105 to provide acoustic isolation, such that the acoustic stack 105 is suspended over an air space to enable mechanical movement. In alternative embodiments, the substrate 110 may be formed with no cavity 115, for example, using SMR technology. For example, the acoustic stack 105 may be formed over an acoustic mirror or a Bragg Reflector (not shown), having alternating layers of high and low acoustic impedance materials, formed in the substrate 110. An acoustic reflector may be fabricated according to various techniques, an example of which is described in U.S. Pat. No. 7,358,831 to Larson, III, et al., which is hereby incorporated by reference.

The acoustic stack 105 includes piezoelectric layer 130 formed between first electrode 120 and second electrode 140. The first electrode 120 includes multiple layers, and is referred to herein as a composite electrode. In various embodiments, the composite first electrode 120 includes a base electrode layer 122, a buried temperature compensating layer, e.g., buried oxide layer 124, and a conductive interposer layer 126 stacked sequentially on the substrate 110. The base electrode layer 122 and the conductive interposer layer 126 are formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

In various embodiments, the base electrode layer 122 and the conductive interposer layer 126 are formed of different conductive materials, where the base electrode layer 122 is formed of a material having relatively lower conductivity and relatively higher acoustic impedance, and the conductive interposer layer 126 is formed of a material having relatively higher conductivity and relatively lower acoustic impedance. For example, the base electrode layer 122 may be formed of W and the conductive interposer layer 126 may be formed of Mo, although other materials and/or combinations of materials may be used without departing from the scope of the present teachings. Further, in various embodiments, the base electrode layer 122 and the conductive interposer layer 126 may be formed of the same conductive material, without departing from the scope of the present teachings.

The buried oxide layer 124 is a temperature compensating layer, and is formed between the base electrode layer 122 and the conductive interposer layer 126. The buried oxide layer 124 is therefore separated or isolated from the piezoelectric layer 130 by the conductive interposer layer 126, and is otherwise sealed in by the connection between the conductive interposer layer 126 and the base electrode layer 122. Accordingly, the buried oxide layer 124 is effectively buried within the composite first electrode 120. The buried oxide layer 124 may be formed of various materials compatible with semiconductor processes, including boron silicate glass (BSG), silicon dioxide ($SiO_2$), chromium (Cr) or tellurium oxide ($TeO_{(x)}$), for example, which have positive temperature coefficients. The positive temperature coefficient of the buried oxide layer 124 offsets negative temperature coefficients of other materials in the acoustic stack 105, including the piezoelectric layer 130, the second base electrode 140, and the base electrode layer 122 and the conductive interposer layer 126 of the composite first electrode 120.

As shown in the embodiment of FIG. 1, the buried oxide layer 124 does not extend the full width of the acoustic stack 105. Thus, the conductive interposer layer 126, which is formed on the top and side surfaces of the buried oxide layer 124, contacts the top surface of the base electrode layer 122, as indicated for example by reference number 129. Therefore, a DC electrical connection is formed between the conductive interposer layer 126 and the base electrode layer 122. By DC electrically connecting with the base electrode layer 122, the conductive interposer layer 126 effectively "shorts" out a capacitive component of the buried oxide layer 124, thus increasing a coupling coefficient ($kt^2$) of the resonator device 100. In addition, the conductive interposer layer 126 provides a barrier that prevents oxygen in the buried oxide layer 124 from diffusing into the piezoelectric layer 130, preventing contamination of the piezoelectric layer 130.

Also, in the depicted embodiment, the buried oxide layer 124 has tapered edges 124a, which enhance the DC electrical connection between the conductive interposer layer 126 and the base electrode layer 122. In addition, the tapered edges 124a enhance the mechanical connection between the conductive interposer layer 126 and the base electrode layer 122, which improves the sealing quality, e.g., for preventing oxygen in the buried oxide layer 124 from diffusing into the piezoelectric layer 130. In alternative embodiments, the edges of the buried oxide layer 124 are not tapered, but may be substantially perpendicular to the top and bottom surfaces of the buried oxide layer 124, for example, without departing from the scope of the present teachings.

The piezoelectric layer 130 is formed on the top surface of the conductive interposer layer 126. The piezoelectric layer 130 may be formed of a thin film piezoelectric compatible with semiconductor processes, such as aluminum nitride (AlN), zinc oxide (ZnO), lead zirconium titanate (PZT), or the like. The thickness of the piezoelectric layer 130 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 130 may be formed on a seed layer (not shown) disposed over an upper surface the composite first electrode 120. For example, the seed layer may be formed of Al to foster growth of an AlN piezoelectric layer 130. The seed layer may have a thickness in the range of about 50 Å to about 5000 Å, for example.

The second electrode 140 is formed on the top surface of the piezoelectric layer 130. The second electrode 140 is formed of an electrically conductive material compatible with semiconductor processes, such as Mo, W, Al, Pt, Ru, Nb, Hf, or the like. In an embodiment, the second electrode 140 is formed of the same material as the base electrode layer 122 of the composite first electrode 120. However, in various embodiments, the second electrode 140 may be formed of the same material as only the conductive interposer layer 126; the second electrode 140, the conductive interposer layer 126 and the base electrode layer 122 may all be formed of the same material; or the second electrode 140 may be formed of a different material than both the conductive interposer layer 126 and the base electrode layer 122, without departing from the scope of the present teachings.

The second electrode 140 may further include a passivation layer (not shown), which may be formed of various types of materials, including AlN, silicon carbide (SiC), BSG, $SiO_2$, SiN, polysilicon, and the like. The thickness of the passivation layer must be sufficient to insulate all layers of the acoustic stack 105 from the environment, including protection from moisture, corrosives, contaminants, debris and the like. The first and second electrodes 120 and 140 are electrically connected to external circuitry via contact pads (not shown), which may be formed of a conductive material, such as gold, gold-tin alloy or the like.

In an embodiment, an overall first thickness $T_{120}$ of the first electrode 120 is substantially the same as an overall second thickness $T_{140}$ of the second electrode 140, as shown in FIG. 1. For example, the thickness of each of the first and second electrodes 120 and 140 may range from about 600 Å to about 30000 Å, although the thicknesses may vary to provide unique benefits for any particular situation or to meet application specific design requirements of various implementations, as would be apparent to one of ordinary skill in the art.

The multiple layers of the composite first electrode 120 have corresponding thicknesses. For example, the thickness of base electrode layer 122 may range from about 400 Å to about 29,900 Å, the thickness of buried oxide layer 124 may range from about 100 Å to about 5000 Å, and the thickness of conductive interposer layer 126 may range from about 100 Å to about 10000 Å. Each of the layers of the composite first electrode 120 may be varied to produce different characteristics with respect to temperature coefficients and coupling coefficients, while the overall first thickness $T_{120}$ of the composite first electrode 120 remains substantially the same as the overall second thickness $T_{140}$ of the second electrode 140. For example, the thickness of the buried oxide layer 124 may be varied to affect the overall temperature coefficient of the acoustic stack 105, and the relative thicknesses of the base electrode layer 122 and the conductive interposer layer 126 may be varied to affect the overall coupling coefficient of the resonator device 100.

Figure 2:
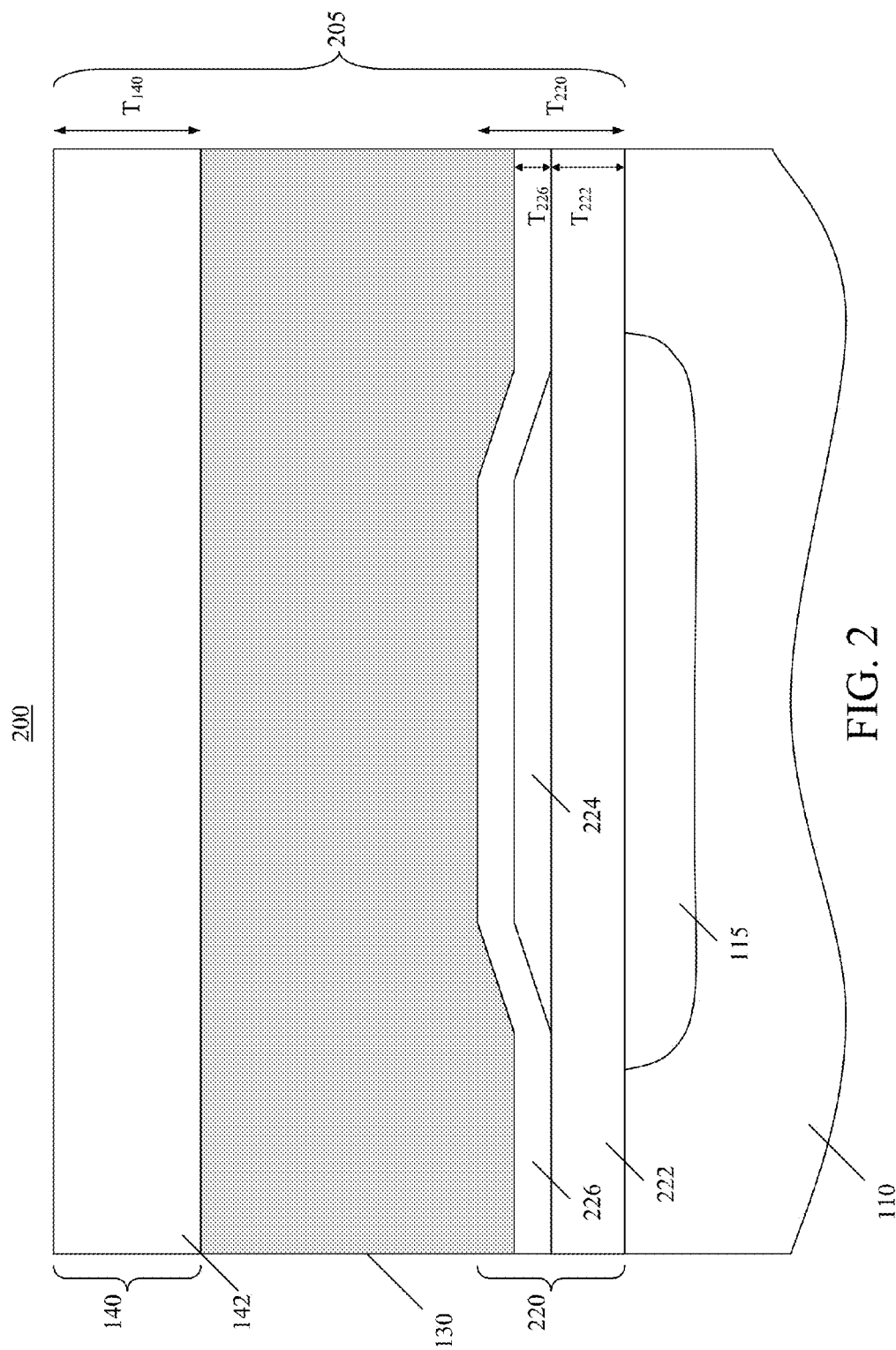
FIG. 2 is a cross-sectional diagram illustrating an acoustic resonator device, including an electrode with a buried temperature compensating layer, according to a representative embodiment.

For example, FIG. 2 depicts a cross-sectional view of an acoustic resonator device, according to another representative embodiment, in which thicknesses of electrode and conductive interposer layers are varied, thus "sinking" a buried temperature compensating layer deeper into a composite first electrode (and further away from the active piezoelectric layer 130).

More particularly, illustrative resonator device 200 of FIG. 2 includes acoustic stack 205 formed on substrate 110. The acoustic stack 205 includes piezoelectric layer 130 formed between a composite first electrode 220 and a second electrode 140. Like reference numerals in FIGS. 1 and 2 refer to like elements, and therefore corresponding descriptions of like elements will not be repeated.

The composite first electrode 220 includes electrode layer 222, buried oxide layer 224 and conductive interposer layer 226 stacked sequentially on the substrate 110, e.g., over the cavity 115. As discussed above with respect to the base electrode layer 122 and the conductive interposer layer 126, the electrode layer 222 and the conductive interposer layer 226 are formed of the same or different electrically conductive materials, such as Mo, W, Al, Pt, Ru, Nb or Hf, for example.

The buried oxide layer 224 is a temperature compensating layer formed between the electrode layer 222 and the conductive interposer layer 226, such that the buried oxide layer 224 is separated from the piezoelectric layer 130 by the conductive interposer layer 226. Accordingly, the buried oxide layer 224 is effectively buried within the composite first electrode 220. As discussed above with respect to the buried oxide layer 124, the buried oxide layer 224 may be formed of various materials compatible with semiconductor processes, including BSG, $SiO_2$, Cr or $TeO_{(x)}$, for example, which have positive temperature coefficients, for offsetting negative temperature coefficients of other materials in the acoustic stack 205.

As discussed above with reference to FIG. 1, the overall thickness of the composite first electrode 220 is substantially the same as the overall thickness of the second electrode 140, as indicated by first thickness $T_{220}$ and second thickness $T_{140}$. However, the thickness $T_{226}$ of the conductive interposer layer 226 in FIG. 2 is greater than the thickness $T_{126}$ of the conductive interposer layer 126 in FIG. 1, such that the buried oxide layer 224 has been buried more deeply, i.e., further "sinking," within the composite first electrode 220 than within the composite first electrode 120. To compensate for the greater thickness $T_{226}$ of the conductive interposer layer 226, the thickness of the electrode layer 222 in FIG. 2 is less than the thickness $T_{122}$ of the base electrode layer 122 in FIG. 1, so that the overall first thickness $T_{220}$ of the composite first electrode 220 remains the same as the overall second thickness $T_{140}$ of the second electrode 140.

The thickness of the oxide layer can also be targeted to be thicker (as it is more deeply buried) to help maintain, or minimize, the linear temperature coefficient. In the depicted example, the thickness of the buried oxide layer 224 is the same as the thickness of the buried oxide layer 124. However, due to the deeper position within the composite first electrode 220, the buried oxide layer 224 causes the coupling coefficient of the resonator device 200 to be relatively greater than the coupling coefficient of the resonator device 100 (at the expense of worsening temperature coefficient). In other words, by adjusting the depth of the buried oxide layer 124, 224, the coupling coefficient of the resonator device 100, 200 may be optimized. Some of the degradation of the temperature coefficient can be "won back" by thickening the buried oxide layer 124, 224. Typically, there is an optimum between final temperature coefficient and coupling coefficient ($kt^2$), depending on application.

Generally, the thickness and the location of the buried oxide layer 124, 224 inside the composite first electrode 120, 220 should be optimized, in order to maximize the coupling coefficient for an allowable linear temperature coefficient. This optimization may be accomplished, for example, by modeling an equivalent circuit of the acoustic stack 105, 205 using a Mason model and adjusting the buried oxide layer 124, 224 by adding more material to the conductive interposer layer 126 and removing material from the base electrode layer 122, so the thickness of the composite first electrode 120, 220 remains constant, as would be apparent to one of ordinary skill in the art. Although there is some degradation in the offsetting effects of the temperature coefficient by sinking the buried oxide layer 124, 224, the coupling coefficient of the resonator device 100, 200 may be improved. An algorithm may be developed to optimize the depth of the buried oxide layer 124, 224 in the composite first electrode 120, 220 in light of the trade-off between the temperature coefficient and the coupling coefficient, for example, using a multivariate optimization technique, such as a Simplex method, as would be apparent to one of ordinary skill in the art. In addition, the depth of the buried oxide layer 124, 224, may be limited by various constraints, such as minimum necessary coupling coefficient and maximum allowable temperature coefficient. Likewise, the thickness of the buried oxide layer 124, 224 may adjusted to provide the optimal coupling coefficient and a minimum overall temperature coefficient of the resonator device 100, 200.

Referring again to FIG. 1, in an illustrative configuration of the acoustic stack 105, the buried oxide layer 124 is formed at a thickness of about 1000 Å using a thin film of BSG (e.g., about two percent by weight boron), which provides a large positive temperature coefficient (e.g., up to about 350 ppm per deg C). Each of the first thickness $T_{120}$ of the first electrode 120 and the second thickness $T_{140}$ of the second electrode 140 (including a passivation layer) is about 3000 Å. Also, the base electrode layer 122 of the first electrode 120 and the second electrode 140 are each formed of Mo. The conductive interposer layer 126 is also made of molybdenum, and in this example would be between about 300 Å and about 600 Å. The piezoelectric layer 130 is formed at a thickness of about 11,000 Å using a thin film of AlN. The acoustic stack 105 with this illustrative configuration has a zero linear temperature coefficient value. Only a residual quadratic term is left (where beta is about −22 ppB per degree $C^2$). However, the maximum coupling coefficient for the resonator device 100 of this configuration is only about four percent. In comparison, when the BSG layer is formed outside of the acoustic stack 105 (as in some conventional resonators), the temperature coefficient has a linear term on the order of about −24 ppm per degree C. and a coupling coefficient that should be on the order of 6.5 percent.

According to various embodiments, the resonator device may be fabricated using various techniques compatible with semiconductor processes. A non-limiting example of a fabrication process directed to representative resonator device 100 is discussed below with reference to FIG. 3.

Figure 3:
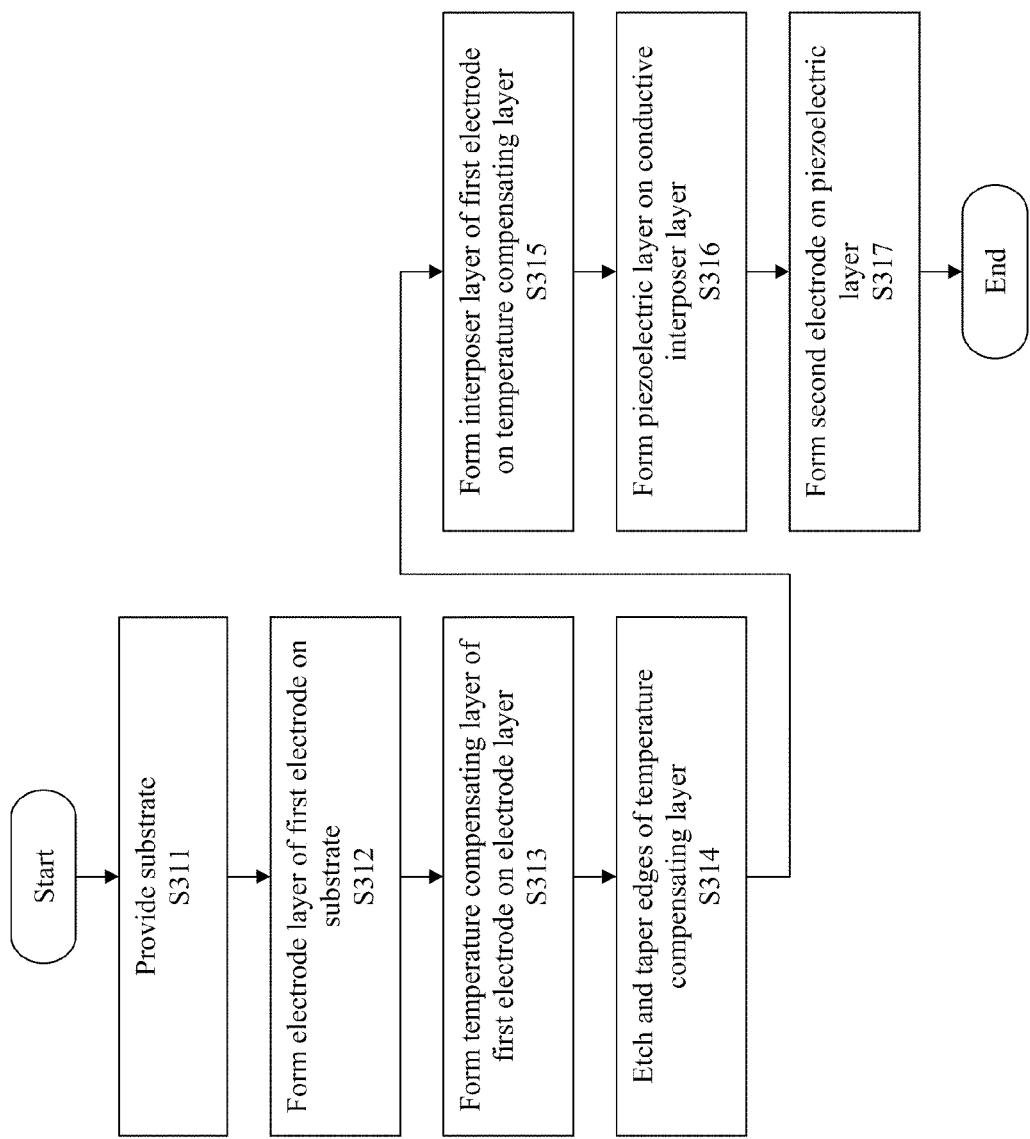
FIG. 3 is a flow diagram illustrating a method of fabricating an acoustic resonator device, according to a representative embodiment.

FIG. 3 is a flow diagram illustrating a method of fabricating a resonator device, according to a representative embodiment.

Referring to FIGS. 1 and 3, substrate 110 is provided in block S311 and the base electrode layer 122 is applied to a top surface of the substrate 110 in block S312. In an embodiment, the substrate 110 is formed of Si and the base electrode layer 122 is formed of W, for example, although different materials may be used, as discussed above, without departing from the scope of the present teachings. The base electrode layer 122 may be applied using spin-on, sputtering, evaporation or chemical vapor disposition (CVD) techniques, for example, although other application methods may be incorporated.

Notably, formation of the cavity 115 in the substrate 110 may be carried out before fabrication of the acoustic stack 105, wherein the cavity 115 is initially filled with a sacrificial material (not shown), such as phosphosilicate glass (PSG) or other release processes, such as polysilicon and xenon difluoride etchant, as would be apparent to one of ordinary skill in the art, during fabrication of layers of the acoustic stack 105. The release of the sacrificial material to form the cavity 115 is carried out using a suitable etchant, such as HF, after fabrication of the layers of the acoustic stack 105 (e.g., after formation of the second electrode 140). In alternative configurations, the cavity 115 may pass through the substrate 110 to form a backside opening, which may be formed by back side etching a bottom surface of the substrate 110. The back side etching may include a dry etch process, such as a Bosch process, for example, although various alternative techniques may be incorporated.

Alternatively, the substrate 110 may include an acoustic isolator, such as an acoustic mirror or Bragg Reflectors, rather than the cavity 115. Such acoustic isolator may be formed in the substrate 110 using any technique compatible with semiconductor processes before forming the acoustic stack 105, as would be apparent to one of ordinary skill in the art.

In block S313, buried oxide layer 124 is formed on a top surface of the base electrode layer 122, to form a temperature compensating layer. In an embodiment, the buried oxide layer 124 is formed of BSG, for example, although different materials may be used, as discussed above, without departing from the scope of the present teachings. The buried oxide layer 124 may be applied using spin-on, sputtering, evaporation or CVD techniques, for example, although other application methods may be incorporated. Various illustrative techniques for forming temperature compensating layers are described, for example, in U.S. Pat. No. 7,561,009 to Larson, III, et al., which is hereby incorporated by reference.

In block S314, the buried oxide layer 124 is etched to a desired size and the tapered edges 124a are tapered. For example, a photoresist layer (not shown) may be applied to the top surface of the buried oxide layer 124 and patterned to form a mask or photoresist pattern, using any phostoresist patterning technique compatible with semiconductor processes, as would be apparent to one of ordinary skill in the art. The photoresist pattern may be formed by machining or by chemically etching the photoresist layer using photolithography, although various alternative techniques may be incorporated. Following etching of the buried oxide layer 124, the photoresist pattern is removed, for example, by chemically releasing or etching using a wet etch process including HF etch solution, although the photoresist pattern may be removed by various other techniques, without departing from the scope of the present teachings.

In various embodiments, to obtain the tapered edges 124a, oxygen is leaked into the etcher used to etch the buried oxide layer 124. The oxide (and/or temperature chuck) causes the photoresist to erode more quickly at the edges of the patterned photo resist and to pull back slightly. This "thinning" of the resist forms a wedge shape profile that is then imprinted into the oxide underneath as the photoresist goes away. Generally, the wedge is created by adjusting the etch rate of resist relative to the etched material, as would be apparent to one of ordinary skill in the art. Meanwhile, further from the edges of the buried oxide layer 124, there is sufficient photoresist coverage throughout the etch that the underlying oxide material is not touched. Of course, other methods of obtaining tapered edges may be incorporated without departing form the scope of the present teachings.

The conductive interposer layer 126 is applied to a top surface of the buried oxide layer 124 in block S315. The conductive interposer layer 126 is formed of Mo, for example, although different materials may be used, as discussed above, without departing from the scope of the present teachings. The conductive interposer layer 126 may be applied using spin-on, sputtering, evaporation or CVD techniques, for example, although other application methods may be incorporated.

In an alternative embodiment, an interim seed layer (not shown) is formed on the top surface of the buried oxide layer 124 before the buried oxide layer 124 is etched. The interim seed layer may be formed of the same piezoelectric material as the piezoelectric layer 130, such as MN, for example. The interim seed layer may be formed to a thickness of about 300 Å, for example, and reduces or minimizes oxide diffusion from the oxide layer 124 into the piezoelectric layer 130. Outer portions of the interim seed layer are removed by etching, along with the etched portions of the buried oxide layer 124, to expose portions of the top surface of the base electrode layer 122, so that the base electrode layer 122 is able to make an electrical connection between with the conductive interposer layer 126. In other words, after etching, the interim seed layer covers only the top surface of the buried oxide layer 124, so that it is positioned between the buried oxide layer 124 and the conductive interposer layer 126.

In block S316, the piezoelectric layer 130 is applied to a top surface of the conductive interposer layer 126, which is also the top surface of the first electrode 120. The piezoelectric layer 130 is formed of AlN, for example, although different materials may be used, as discussed above, without departing from the scope of the present teachings. The piezoelectric layer 130 may be applied using a sputtering technique, for example, although other application methods may be incorporated. For example, the piezoelectric layer 130 may be grown from a seed layer, as discussed above, according to various techniques compatible with semiconductor processes.

The second electrode 140 is applied to a top surface of the piezoelectric layer 130 in block S317. The is second electrode 140 formed of W, for example, although different materials may be used, as discussed above, without departing from the scope of the present teachings. The second electrode 140 may be applied using spin-on, sputtering, evaporation or CVD techniques, for example, although other application methods may be incorporated. In various embodiments, the second electrode 140 includes a passivation layer formed of BSG, $SiO_2$, SiN, polysilicon, or the like.

The resonator device 100 may then be cut or separated from a wafer, to the extent necessary, in order to form a singulated die. The resonator device 100 may be separated using various techniques compatible with semiconductor fabrication processes, such as scribe and break, for example.

Figure 4:
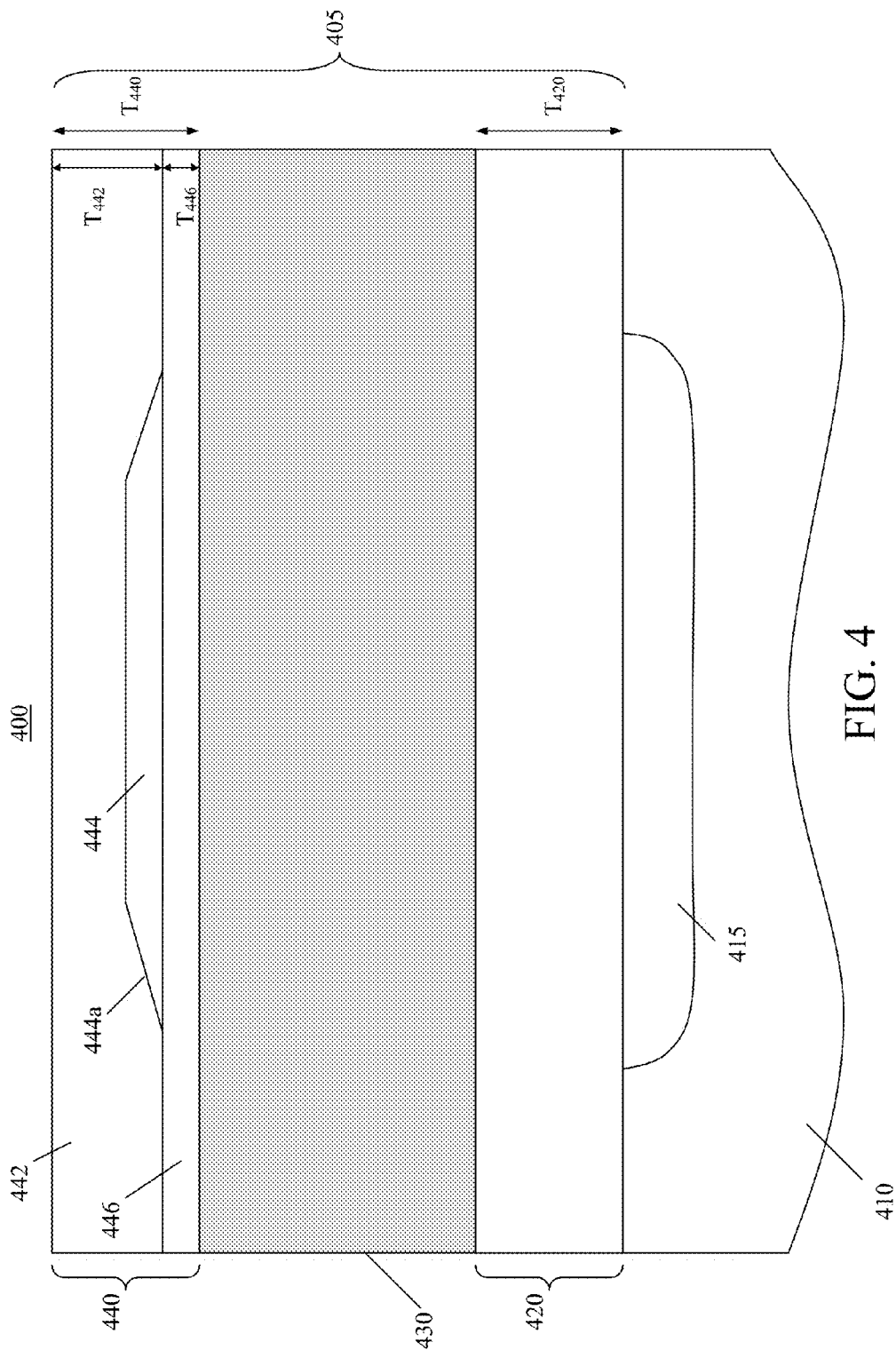
FIG. 4 is a cross-sectional diagram illustrating an acoustic resonator device, including an electrode with a buried temperature compensating layer, according to a representative embodiment.

FIG. 4 is a cross-sectional view of an acoustic resonator device, which includes an electrode having a buried temperature compensating layer, according to a representative embodiment, in which the acoustic stack of the resonator device is reversed, such that the second (top) electrode is a composite electrode, as opposed to the first (bottom) electrode.

Referring to FIG. 4, illustrative resonator device 400 includes acoustic stack 405 formed on substrate 410. The substrate 410 may be formed of various types of semiconductor materials, Si, GaAs, InP, or the like, and may include a cavity 415 or an acoustic isolator, as discussed above with respect to substrate 110 in FIG. 1. The acoustic stack 405 includes piezoelectric layer 430 formed between a first electrode 420 and a composite second electrode 440.

More particularly, the first electrode 420 is formed of an electrically conductive material, such as W, Mo, Al, Pt, Ru, Nb or Hf, for example, on the substrate 410. The piezoelectric layer 430 is formed of a piezoelectric material, such as AlN, ZnO or PZT, for example, on the first electrode 420. The composite second electrode 440 is formed on the piezoelectric layer 430, such that a buried oxide layer 444 is separated from the piezoelectric layer 430 by a conductive interposer layer 446.

For example, in an embodiment, the conductive interposer layer 446 is applied to the top, substantially planar surface of the piezoelectric layer 430 at a desired thickness $T_{446}$. As discussed above, the thicker the conductive interposer layer 446, the more buried the buried oxide layer 444 is within the composite second electrode 440 (i.e., further removed from the piezoelectric layer 430). The buried oxide layer 444 is then applied to the top surface of the conductive interposer layer 446 to form a temperature compensating layer. The buried oxide layer 444 may be applied using spin-on, sputtering, evaporation or CVD techniques, for example, although other application methods may be incorporated. Also, the buried oxide layer 444 is etched to a desired size and the edges 444a may be tapered, as discussed above with respect to the buried oxide layer 124.

The electrode layer 442 is formed over the buried oxide layer 444 and the conductive interposer layer 446. The electrode layer 442 has a thickness $T_{442}$ (at outer portions, not over the buried oxide layer 444), which may include a passivation layer (not shown), as discussed above. The thickness $T_{442}$ may vary such that an overall second thickness $T_{440}$ of the composite second electrode 440 is substantially the same as an overall first thickness $T_{420}$ of the first electrode 420.

As discussed above, the conductive interposer layer 446 and the electrode layer 442 are formed of electrically conductive materials, such W, Mo, Al, Pt, Ru, Nb or Hf, for example. Also, the conductive interposer layer 446 and the electrode layer 422 may be formed of the same or different materials, to provide various benefits or to meet application specific design requirements of various implementations, as would be apparent to one of ordinary skill in the art. In an embodiment, the electrode layer 442 is formed of the same material as the first electrode 420, although the electrode layer 442 and the first electrode 420 may be formed of different materials from one another in alternative embodiments.

The buried oxide layer 444 is a temperature compensating layer, formed between the conductive interposer layer 446 and the electrode layer 442, in substantially the same manner discussed above with respect to buried oxide layer 124. The buried oxide layer 444 may be formed of various materials compatible with semiconductor processes, including BSG, $SiO_2$, SiN, or polysilicon, for example, which have positive temperature coefficients. Because the buried oxide layer 444 does not extend the full width of the acoustic stack 405, the conductive interposer layer 446 forms a DC electrical connection with the electrode layer 442, which effectively "shorts" out a capacitive component of the buried oxide layer 444 and increases a coupling coefficient ($kt^2$) of the resonator stack 400, as discussed above. In addition, the conductive interposer layer 446 provides a barrier that prevents oxygen in the buried oxide layer 444 from diffusing into the piezoelectric layer 430.

In various additional embodiments, the acoustic stack of the resonator device may include composite electrodes formed on both the top and bottom surfaces of the piezoelectric layer, without departing from the scope of the present teachings.

According to various embodiments, an acoustic stack of a resonator device has at least one composite electrode that includes a buried temperature compensating layer separated from a piezoelectric layer by a conductive interposer layer. The temperature compensating layer has a temperature coefficient that has an opposite sign from a temperature coefficient of at least one other element in the acoustic stack, thus offsetting the effects of that temperature coefficient. Further, the conductive interposer layer effectively shorts out a capacitive component of the temperature compensating layer, which effectively increases a coupling coefficient of the resonator device. Accordingly, this enables more stable operation of the resonator, for example, by preventing shifts in passband due to increases in temperature, while preventing contamination of the piezoelectric material by the material in the temperature compensating layer.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An acoustic resonator device comprising:
   a composite first electrode over a substrate, the first electrode comprising first and second electrically conductive layers and a buried temperature compensating layer between the first and second electrically conductive layers, the temperature compensating layer having a positive temperature coefficient;
   a piezoelectric layer on the first electrode, the piezoelectric layer having a negative temperature coefficient; and
   a second electrode on the piezoelectric layer, wherein the positive temperature coefficient of the temperature compensating layer offsets at least a portion of the negative temperature coefficient of the piezoelectric layer,
   wherein the temperature compensating layer comprises tapered edges.

2. The device of claim 1, wherein the first electrically conductive layer comprises a first metal layer formed on the substrate; and
   the second electrically conductive layer comprises a second metal layer formed on the temperature compensating layer.

3. The device of claim 2, wherein the temperature compensating layer comprises an oxide material.

4. The device of claim 2, wherein a depth of the temperature compensating layer within the composite first electrode is determined by a thickness of the second metal layer relative to a thickness of the first metal layer.

5. The device of claim 4, wherein the depth of the temperature compensating layer within the composite first electrode affects a coupling coefficient of the acoustic resonator device.

6. The device of claim 3, wherein the oxide material comprises boron silicate glass (BSG).

7. The device of claim 3 wherein a thickness of the temperature compensating layer is adjusted for an optimal coupling coefficient and a minimum temperature coefficient of the resonator device.

8. The device of claim 6, wherein the first metal layer comprises tungsten and the second metal layer comprises molybdenum, and wherein the second electrode comprises tungsten.

9. The device of claim 1, wherein the second electrode has a negative temperature coefficient, the positive temperature coefficient of the temperature compensating layer further offsetting at least a portion of the negative temperature coefficient of the second electrode in addition to offsetting at least the portion of the negative temperature coefficient of the piezoelectric layer.

10. The device of claim 1, wherein the substrate defines a cavity over which the first electrode is positioned.

11. The device of claim 1, wherein the substrate includes an acoustic mirror over which the first electrode is positioned.

12. A filter having a passband for filtering at least one of transmitted or received radio frequency (RF) signals, the filter comprising:
   the acoustic resonator device of claim 1, wherein
   the buried temperature compensating layer comprises a buried boron silicate glass (BSG) layer, and the first electrically conductive layer connects with the second electrically conductive layer making a DC electrical contact and isolating the BSG layer from the piezoelectric layer.

13. The filter of claim 12, wherein the positive temperature coefficient of the BSG layer offsets the at least a portion of the negative temperature coefficient of the piezoelectric layer, reducing shifts in the passband due to increases in operational temperature of the filter.

14. An acoustic resonator device comprising:
   a composite first electrode on a substrate, the first electrode comprising first and second electrically conductive layers and a buried temperature compensating layer between the first and second electrically conductive layers, the temperature compensating layer having a positive temperature coefficient;

a piezoelectric layer on the first electrode, the piezoelectric layer having a negative temperature coefficient; and a second electrode on the piezoelectric layer, wherein the positive temperature coefficient of the temperature compensating layer offsets at least a portion of the negative temperature coefficient of the piezoelectric layer, wherein the temperature compensating layer comprises an oxide material, and wherein the first electrode further comprises an interim seed layer formed between the temperature compensating layer and the second metal layer, the interim seed layer reducing oxide diffusion from the temperature compensating layer into the piezoelectric layer.

15. An acoustic resonator device comprising:
a composite first electrode over a substrate, the first electrode comprising first and second electrically conductive layers and a buried temperature compensating layer between the first and second electrically conductive layers, the temperature compensating layer having a positive temperature coefficient;
a piezoelectric layer on the first electrode, the piezoelectric layer having a negative temperature coefficient; and
a second electrode on the piezoelectric layer, wherein the positive temperature coefficient of the temperature compensating layer offsets at least a portion of the negative temperature coefficient of the piezoelectric layer, wherein the second electrically conductive layer forms an electrical contact with the first electrically conductive layer on at least one side of the temperature compensating layer, the electrical contact electrically shorting a capacitive component of the temperature compensating layer.

16. The device of claim 15, wherein the temperature compensating layer includes tapered edges.

17. An acoustic resonator device comprising:
a substrate;
a first electrode formed on the substrate;
a piezoelectric layer formed on the first electrode, the piezoelectric layer having a negative temperature coefficient; and
a second electrode formed on the piezoelectric layer, wherein at least one of the first and second electrodes is a composite electrode comprising:
a buried oxide layer having a positive temperature coefficient offsetting at least a portion of the negative temperature coefficient of the piezoelectric layer;
a conductive interposer layer formed between the oxide layer and the piezoelectric layer; and
a base electrode layer formed on an opposite side of the oxide layer from the conductive interposer layer, the base electrode layer contacting the conductive interposer layer to form a seal around the oxide layer, isolating the oxide layer from the piezoelectric layer.

18. The device of claim 17, wherein the base electrode layer contacting the conductive interposer layer further electrically connects the base electrode layer and the conductive interposer layer, effectively shorting out a capacitive component of the oxide layer and increasing a coupling coefficient of the resonator device.

19. The device of claim 17, wherein only one of the first and second electrodes is the composite electrode.

20. The device of claim 17, wherein both the first and second electrodes are composite electrodes.

21. An acoustic resonator device, comprising:
a substrate;
a composite electrode disposed over the substrate, the composite electrode comprising first and second electrically conductive layers and a temperature compensating layer disposed between the first and second electrically conductive layers, wherein the second electrically conductive layer forms an electrical contact with the first electrically conductive layer on at least one side of the temperature compensating layer, the electrical contact electrically shorting a capacitive component of the temperature compensating layer;
a piezoelectric layer adjacent to the composite electrode;
an acoustic reflector disposed beneath the composite electrode; and
an interim seed layer formed between the temperature compensating layer and the second metal layer, the interim seed layer reducing oxide diffusion from the temperature compensating layer into the piezoelectric layer.

22. The acoustic resonator device of claim 21, wherein the first electrically conductive layer comprises a first metal layer; and the second electrically conductive layer comprises a second metal layer disposed on the temperature compensating layer.

23. The acoustic resonator device of claim 22, wherein the temperature compensating layer comprises an oxide material.

24. The acoustic resonator device of claim 23, wherein the oxide material comprises boron silicate glass (BSG).

25. The acoustic resonator device of claim 23, wherein a thickness of the temperature compensating layer is adjusted for an optimal coupling coefficient and a minimum temperature coefficient of the resonator device.

26. The device of claim 24, wherein the first metal layer comprises tungsten and the second metal layer comprises molybdenum, and wherein the second electrode comprises tungsten.

27. The acoustic resonator device of claim 22, wherein a depth of the temperature compensating layer within the composite first electrode is determined by a thickness of the second metal layer relative to a thickness of the first metal layer.

28. The acoustic resonator device of claim 27, wherein the depth of the temperature compensating layer within the composite first electrode affects a coupling coefficient of the acoustic resonator device.

* * * * *